United States Patent
Tsuchiya et al.

(10) Patent No.: US 8,290,743 B2
(45) Date of Patent: Oct. 16, 2012

(54) CHARGED PARTICLE BEAM WRITING APPARATUS AND METHOD FOR DIAGNOSING DAC AMPLIFIER UNIT IN CHARGED PARTICLE BEAM WRITING APPARATUS

(75) Inventors: Seiichi Tsuchiya, Shizuoka (JP); Akinori Mine, Shizuoka, PA (US)

(73) Assignee: NuFlare Technology, Inc., Numazu-shi (JP)

( * ) Notice: Subject to any disclaimer, the term of this patent is extended or adjusted under 35 U.S.C. 154(b) by 493 days.

(21) Appl. No.: 12/507,385

(22) Filed: Jul. 22, 2009

(65) Prior Publication Data

US 2010/0030522 A1  Feb. 4, 2010

(30) Foreign Application Priority Data

Jul. 30, 2008  (JP) ................................. 2008-196055

(51) Int. Cl.
*G06F 11/00* (2006.01)
(52) U.S. Cl. .................. 702/183; 250/492.1; 250/492.2; 250/492.3
(58) Field of Classification Search .................. 702/183; 250/492.1–492.3
See application file for complete search history.

(56) References Cited

U.S. PATENT DOCUMENTS

| 4,758,781 | A | * | 7/1988 | Ueno et al. | 324/73.1 |
| 5,909,186 | A | * | 6/1999 | Gohringer | 341/120 |
| 6,137,111 | A | * | 10/2000 | Yamada et al. | 250/492.2 |
| 2007/0138413 | A1 | * | 6/2007 | Abe et al. | 250/492.22 |
| 2007/0229337 | A1 | * | 10/2007 | Sanmiya et al. | 341/144 |

FOREIGN PATENT DOCUMENTS

JP  2007-324229  12/2007

* cited by examiner

*Primary Examiner* — Michael Nghiem
*Assistant Examiner* — Alexander Satanovsky
(74) *Attorney, Agent, or Firm* — Oblon, Spivak, McClelland, Maier & Neustadt, L.L.P.

(57) ABSTRACT

The charged particle beam writing apparatus includes a position deflection control circuit. First digital data that is to be used for circuit diagnosis is transmitted from the position deflection control circuit to the DAC amplifier unit at the same rate as a rate of writing on a product reticle and stored in a first maintenance memory. Second digital data is output from a digital section included in the DAC amplifier unit in response to the first digital data and stored in a second maintenance memory. A maintenance clock generator generates a clock signal and reads the first digital data stored in the first maintenance memory and the second digital data stored in the second maintenance memory. The first digital data thus read is compared with the second digital data thus read for each bit to diagnose the digital section.

12 Claims, 6 Drawing Sheets

CHARGED PARTICLE BEAM WRITING APPARATUS AND METHOD FOR DIAGNOSING DAC AMPLIFIER UNIT IN CHARGED PARTICLE BEAM WRITING APPARATUS

BACKGROUND OF THE INVENTION

1. Field of the Invention

The present invention relates to a charged particle beam writing apparatus and a method for diagnosing a DAC amplifier unit in the charged particle beam writing apparatus.

2. Background Art

In a process for manufacturing semiconductor devices, a reticle is used to form a fine circuit pattern. It is known that an electron beam writing apparatus, one of charged particle beam writing apparatuses, is used to form a pattern in a reticle.

In recent years, to achieve higher integration of the semiconductor devices, the pattern of the reticle has been finer and finer and the number of shots per reticle has increased to tera-level shots per reticle. With the increased number of shots per reticle, the amount of entire shot data increases. In addition, it is requested to improve a writing throughput and thus a data transfer rate between a deflection control circuit and a digital-to-analog converter (DAC) amplifier unit is increased. Also, the DAC amplifier unit has a higher processing rate.

The DAC amplifier unit has a digital section that outputs digital data received from the deflection control circuit to a digital-to-analog converter (DAC). With the above-mentioned increase in the data transfer rate and processing rate, the digital data input to the digital section is switched at high speed. As a result, an error may easily occur in the digital section included in the DAC amplifier unit. If an error occurs in the DAC amplifier unit, then the reticle will be defective. For that reason, it is necessary to diagnose the operation of the DAC amplifier unit.

Conventionally known methods for diagnosing a DAC amplifier unit include a linearity test using a digital multimeter. In the linearity test, analog data converted from digital data by a DAC is input to the digital multimeter at a rate lower than an actual writing rate. The digital multimeter then converts the analog data into digital data. The digital data converted by the digital multimeter is compared with the original digital data to diagnose static characteristics of the DAC amplifier unit.

Errors in the digital section accompanied by the aforementioned increased rates cannot be found based on only diagnosis of the static characteristics of the DAC amplifier unit, which means that the DAC amplifier unit is not sufficiently diagnosed. Thus, the need to diagnose dynamic characteristics of the DAC amplifier unit increases. Since when a failure occurs in the DAC amplifier unit it is difficult to specify the location of the failure, the electron beam writing apparatus will disadvantageously remain down for a long period of time.

An apparatus for maintaining and controlling the electron beam writing apparatus as to whether it is in normal operation or not is known in the art (refer to Japanese Patent Laid-open No. 2007-324229, for example). An apparatus described in Japanese Patent Laid-open No. 2007-324229 has a write circuit. The write circuit receives predetermined layout information and a writing condition. As a result, the write circuit outputs write processing data. The apparatus collects the write processing data and compares the write processing data with correct data to diagnose the write circuit. Japanese Patent Laid-open No. 2007-324229, however, does not describe diagnosis of dynamic characteristics of the DAC amplifier unit.

The present invention has been devised to solve the aforementioned problem. It is, therefore, an object of the present invention to provide a charged particle beam writing apparatus capable of diagnosing dynamic characteristics of a DAC amplifier unit and a method for diagnosing the DAC amplifier unit in the charged particle beam writing apparatus.

SUMMARY OF THE INVENTION

According to one aspect of the present invention, in a method for diagnosing a DAC amplifier unit in a charged particle beam writing apparatus, first digital data for diagnosis of a circuit is transmitted from a deflection control circuit included in the charged particle beam writing apparatus to the DAC amplifier unit at the same rate as a rate of writing on a product reticle and storing the first digital data. Second digital data output from a digital section included in the DAC amplifier unit in response to the first digital data is stored. The first digital data and the second digital data which have been stored are read. The first digital data and the second digital data which have been read are compared for each bit to diagnose the digital section.

According to another aspect of the present invention, a charged particle beam writing apparatus comprises a deflection control circuit for transmitting digital data that is used to control a deflector and storing the transmitted digital data in a first maintenance memory included in the deflection control circuit, a DAC amplifier unit having a digital section, an analog section, and a second maintenance memory, the digital section being adapted to output the digital data received from the deflection control circuit to a DAC that converts the digital data into analog data, the analog section being adapted to amplify the analog data converted by the DAC, the second maintenance memory being adapted to store the digital data output from the digital section, and a diagnosis unit for diagnosing the digital section. The diagnosis unit causes first digital data for diagnosis of a circuit to be transmitted from the deflection control circuit to the DAC amplifier unit at the same rate as a rate of writing on a product reticle and stored in the first maintenance memory, causes second digital data output from the digital section in response to the first digital data to be stored in the second maintenance memory, reads the first digital data stored in the first maintenance memory and the second digital data stored in the second maintenance memory, and compares the first digital data and the second digital data which have been read for each bit to diagnose the digital section.

Other features and advantages of the present invention are apparent from the following description.

DETAILED DESCRIPTION OF THE EMBODIMENTS

Figure 1:
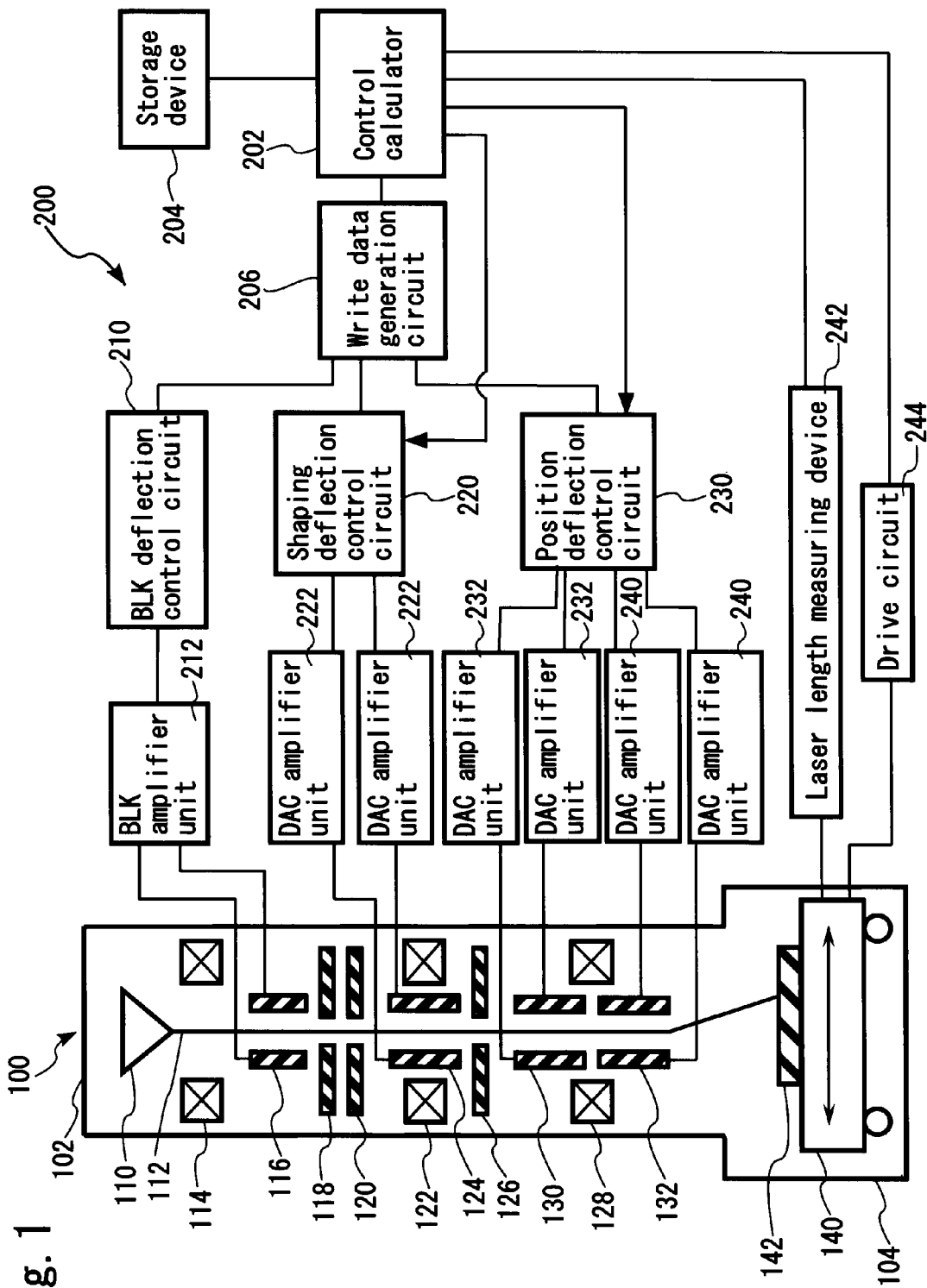
FIG. 1 is a schematic view showing the configuration of an electron beam writing apparatus according to an embodiment of the present invention.

FIG. 1 is a schematic view showing the configuration of an electron beam writing apparatus according to an embodiment of the present invention. The electron beam writing apparatus shown in FIG. 1 has a writing unit 100. The writing unit 100 has an electron lens barrel 102. The electron lens barrel 102 has an illumination lens 114 and an electron gun 110 therein. The electron gun 110 emits an electron beam (e.g., an electron beam accelerated by means of a voltage of 50 kV) 112. The illumination lens 114 is used in order to irradiate a first shaping aperture 120 with the electron beam 112.

The writing unit 100 also has a blanking (BLK) deflector 116 and a blanking (BLK) aperture 118 that are located between the illumination lens 114 and the first shaping aperture 120. When blanking is turned on (or when a writing operation is not performed), the electron beam 112 deflected by the BLK deflector 116 is cut by the BLK aperture 118. The BLK deflector 116 is composed of a pair of electrodes, for example. During diagnosis of a DAC amplifier unit(s) (described later), the blanking is turned on.

The first shaping aperture 120 has a rectangular opening. The electron beam 112 passes through the first shaping aperture 120. The electron beam 112 is then formed to ensure that a cross section of the electron beam is rectangular. The formed electron beam 112 is projected on a second shaping aperture 126 by a projecting lens 122. A shaping deflector 124 is provided between the second shaping aperture 126 and the first shaping aperture 120. The shaping deflector 124 is concentric with the electron lens barrel 102. The shaping deflector 124 controls the position of an image coming from the first shaping aperture 120 provided above the second shaping aperture 126. The control performed by the shaping deflector 124 changes the degree of overlap of the image coming from the first shaping aperture 120 with an opening of the second shaping aperture 126. Thus, the shape and dimensions of the electron beam 112 can be controlled.

A focal point of the electron beam passing through the second shaping aperture 126 is positioned on the surface of a sample 142 by an objective lens 128. The sample 142 is present in a writing chamber 104 and on an XY stage 140. The XY stage 140 continuously moves in an X direction (left-right direction of FIG. 1) and a Y direction (depth direction of FIG. 1) in the writing chamber 104. The XY stage 140 is driven by a drive circuit 244. The position of the XY stage 140 is measured by a laser length measuring device 242.

The sample 142 is a reticle formed by laminating, on a glass substrate, a light shielding film such as a chrome film and a resist film, for example.

A main deflector 130 and an auxiliary deflector 132, which are objective deflectors, are provided between the sample 142 and the second shaping aperture 126 and concentric with the electron lens barrel 102. The position of a spot of the electron beam 112 on the sample 142 is determined by the main deflector 130 and the auxiliary deflector 132.

Figure 2:
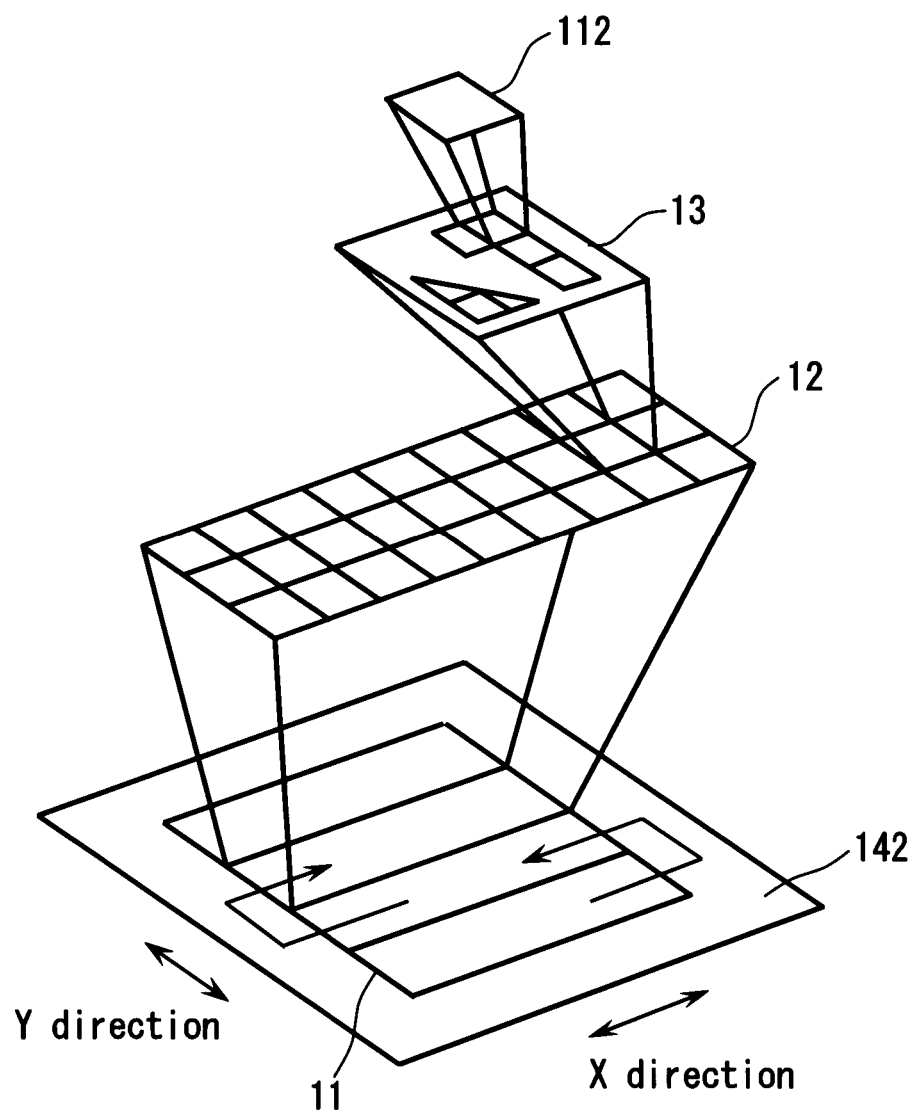
FIG. 2 is a diagram showing write processing on a product reticle 142.

To perform writing by means of the electron beam writing apparatus, a pattern 11 that is to be drawn on the sample 142 is divided into strip-shaped frame regions 12 as shown in FIG. 2. Each of the frame regions 12 is drawn while the XY stage 140 continuously moves in the X direction. Each of the frame regions 12 is further divided into subfield regions 13. The electron beam 112 formed by the first and second shaping apertures 120, 126 is deflected to ensure that the spot of the electron beam 112 is positioned only in necessary areas of the subfield regions 13 to perform the writing.

The main deflector 130 and the auxiliary deflector 132 constitute a two-stage objective deflector. The two-stage objective deflector is used to deflect the electron beam 112. The main deflector 130 determines which subfield region 13 is to be irradiated with the electron beam 112. The auxiliary deflector 132 determines which area of the subfield region 13 is to be irradiated with the electron beam 112.

The electron beam writing apparatus shown in FIG. 1 has a controller 200. The controller 200 includes a control calculator 202. The control calculator 202 controls parts of the electron beam writing apparatus.

The control calculator 202 is connected with a storage device 204 that stores a plurality of pattern data pieces. Each of the pattern data pieces is a digital data piece describing the shape, position and the like of a pattern.

The control calculator 202 has a memory 203 (refer to FIG. 4) therein. The memory 203 has pattern data stored therein. The pattern data stored in the memory 203 is to be used to diagnose circuits of digital sections included in DAC amplifier units 222, 232 and 240. The pattern data indicates a pattern that caused an error in any of the digital sections included in the DAC amplifier units 222, 232 and 240 in the past.

The control calculator 202 is connected with a write data generation circuit 206. The write data generation circuit 206 is connected with a BLK deflection control circuit 210, a shaping deflection control circuit 220 and a position deflection control circuit 230.

The write data generation circuit 206 receives the pattern data from the control calculator 202. The write data generation circuit 206 performs distributed processing and expansion processing on the received pattern data to generate write data for each shot. The write data generation circuit 206 transmits the generated write data for each shot to the deflection control circuits 210, 220 and 230. Each of the deflection control circuits 210, 220 and 230 receives the write data and generates digital data based on the received write data. The generated digital data is used to control the deflectors.

The BLK deflection control circuit 210 turns on and off the blanking. When the blanking is turned on, the writing is not performed. When the blanking is turned off, the writing is performed. The BLK deflection control circuit 210 retrieves, from the write data received from the write data generation circuit 206, information indicating a time length of the blanking and a time length of the non-blanking. The BLK deflection control circuit 210 generates a timing pulse signal based on the time length information and transmits the generated timing pulse signal to a BLK amplifier unit 212. The BLK amplifier unit 212 receives the timing pulse signal. The BLK amplifier unit 212 amplifies the received timing pulse signal to ensure that the BLK deflector 116 can be driven. Then, the BLK amplifier unit 212 transmits the amplified signal to the BLK deflector 116.

The shaping deflection control circuit 220 for controlling the shape and size of the beam transmits a plurality of digital data pieces, while the shaping deflection control circuit 220 operates in synchronization with the plurality of DAC amplifier units 222. The digital data pieces are used to control the shaping deflector 124. The digital data pieces are instruction voltage signals (digital signals) and are to be transmitted to a plurality of electrodes (described later) constituting the shaping deflector 124. The DAC amplifier units 222 are provided for the respective electrodes of the shaping deflector 124. The DAC amplifier units 222 receive the digital data pieces from the shaping deflection control circuit 220 and convert the received digital data pieces into analog data pieces, respectively. The DAC amplifier units 222 amplify the converted analog data pieces. The DAC amplifier units 222 then transmit the amplified analog data pieces to the corresponding electrodes of the shaping deflector 124, respectively.

The position deflection control circuit 230 is adapted to control the position of the beam spot on the sample 142. The position deflection control circuit 230 transmits a plurality of digital data pieces to the plurality of DAC amplifier units 232 and 240, while the position deflection control circuit 230 operates in synchronization with the DAC amplifier units 232 and 240. The plurality of digital data pieces are used to control the main deflector 130 and the auxiliary deflector 132.
The plurality of digital data pieces are instruction voltage signals (digital signals) and are to be transmitted to a plurality of electrodes (described later) constituting the main deflector 130 and the auxiliary deflector 132. The DAC amplifier units 232 and 240 are provided for the respective electrodes constituting the main deflector 130 and the auxiliary deflector 132. The DAC amplifier units 232 and 240 receive the digital data from the position deflection control circuit 230 and convert the received digital data into analog data. Then, the DAC amplifier units 232 and 240 amplify the converted analog data. The DAC amplifier units 232 and 240 transmit the amplified analog data to the corresponding electrodes constituting the main deflector 130 and the auxiliary deflector 132, respectively.

Figure 3:
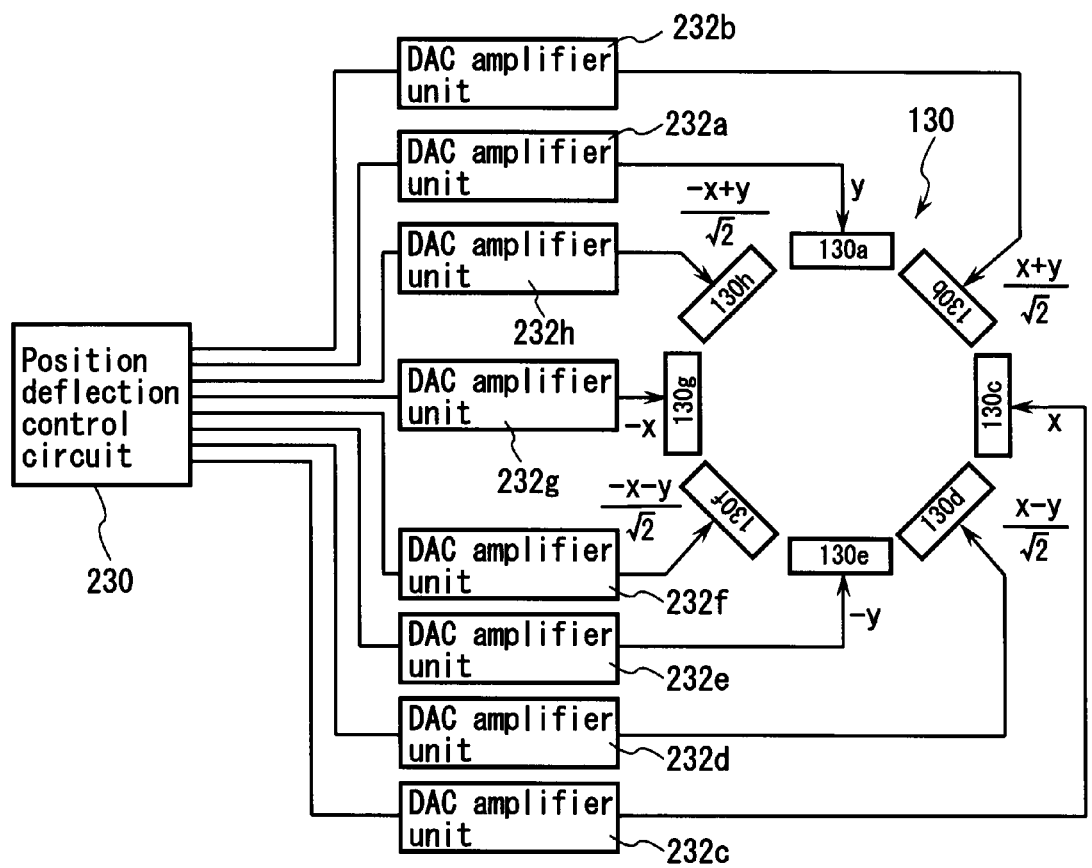
FIG. 3 is a diagram showing a main deflector 130 composed of eight electrodes and eight DAC amplifier units 232 that apply voltages to the respective electrodes.

Each of the shaping deflector 122, the main deflector 130 and the auxiliary deflector 132 may be replaced with an electrostatic deflector composed of eight electrodes (four pairs of electrodes of which each pair faces each other). The main deflector 130 that is the electrostatic deflector composed of the eight electrodes is described below with reference to FIG. 3. FIG. 3 shows the main deflector 130 composed of the eight electrodes and eight DAC amplifier units 232. The DAC amplifier units 232 shown in FIG. 3 apply analog data to the electrodes, respectively.

As shown in FIG. 3, the main deflector 130 is composed of the eight electrodes 130$a$ to 130$h$. The DAC amplifier units 232$a$ to 232$h$ apply analog voltages to the electrodes 130$a$ to 130$h$, respectively.

Specifically, the DAC amplifier unit 232$a$ applies a voltage "y" to the electrode 130$a$. The DAC amplifier unit 232$e$ applies a voltage "−y" to the electrode 130$e$. The electrode 130$e$ faces the electrode 130$a$. The DAC amplifier unit 232$b$ applies a voltage "(x+y)/$\sqrt{2}$" to the electrode 130$b$. The DAC amplifier unit 232$f$ applies a voltage "(−x−y)/$\sqrt{2}$" to the electrode 130$f$. The electrode 130$f$ faces the electrode 130$b$.

The DAC amplifier unit 232$c$ applies a voltage "x" to the electrode 130$c$. The DAC amplifier unit 232$g$ applies a voltage "−x" to the electrode 130$g$. The electrode 130$g$ faces the electrode 130$c$. The DAC amplifier unit 232$d$ applies a voltage "(x−y)/$\sqrt{2}$" to the electrode 130$d$. The DAC amplifier unit 232$h$ applies a voltage "(−x+y)/$\sqrt{2}$" to the electrode 130$h$. The electrode 130$h$ faces the electrode 130$d$.

When the position deflection control circuit 230 transmits the digital data that is used to control the electrodes 130$a$ to 130$h$ constituting the main deflector 130 to the DAC amplifier units 232$a$ to 232$h$, the DAC amplifier units 232$a$ to 232$h$ apply the analog voltages to the respective electrodes 130$a$ to 130$h$. Thus, the main deflector 130 is capable of determining, with high accuracy, which subfield region 13 is to be irradiated.

In FIG. 3, the main deflector 130 is composed of the four pairs of electrodes (eight electrodes). The main deflector 130 may be composed of two pairs of electrodes (four electrodes). The shaping deflector 124 may be composed of two pairs of electrodes (four electrodes), and the auxiliary deflector 132 may be composed of two pairs of electrodes (four electrodes). It should be noted that FIG. 1 shows one pair of electrodes (two electrodes) constituting the shaping deflector 124, one pair of electrodes (two electrodes) constituting the main deflector 130, and one pair of electrodes (two electrodes) constituting the auxiliary deflector 132, for clarity of the illustration.

The following describes diagnosis of dynamic characteristics of the DAC amplifier unit. The diagnosis is a feature of the present invention. The dynamic characteristics mean characteristics of an operation of the DAC amplifier unit at an actual writing rate. In the present embodiment, diagnosis of the dynamic characteristics of the DAC amplifier unit 232 provided for the main deflector 130 is described below with reference to FIGS. 4 to 6.

Figure 4:
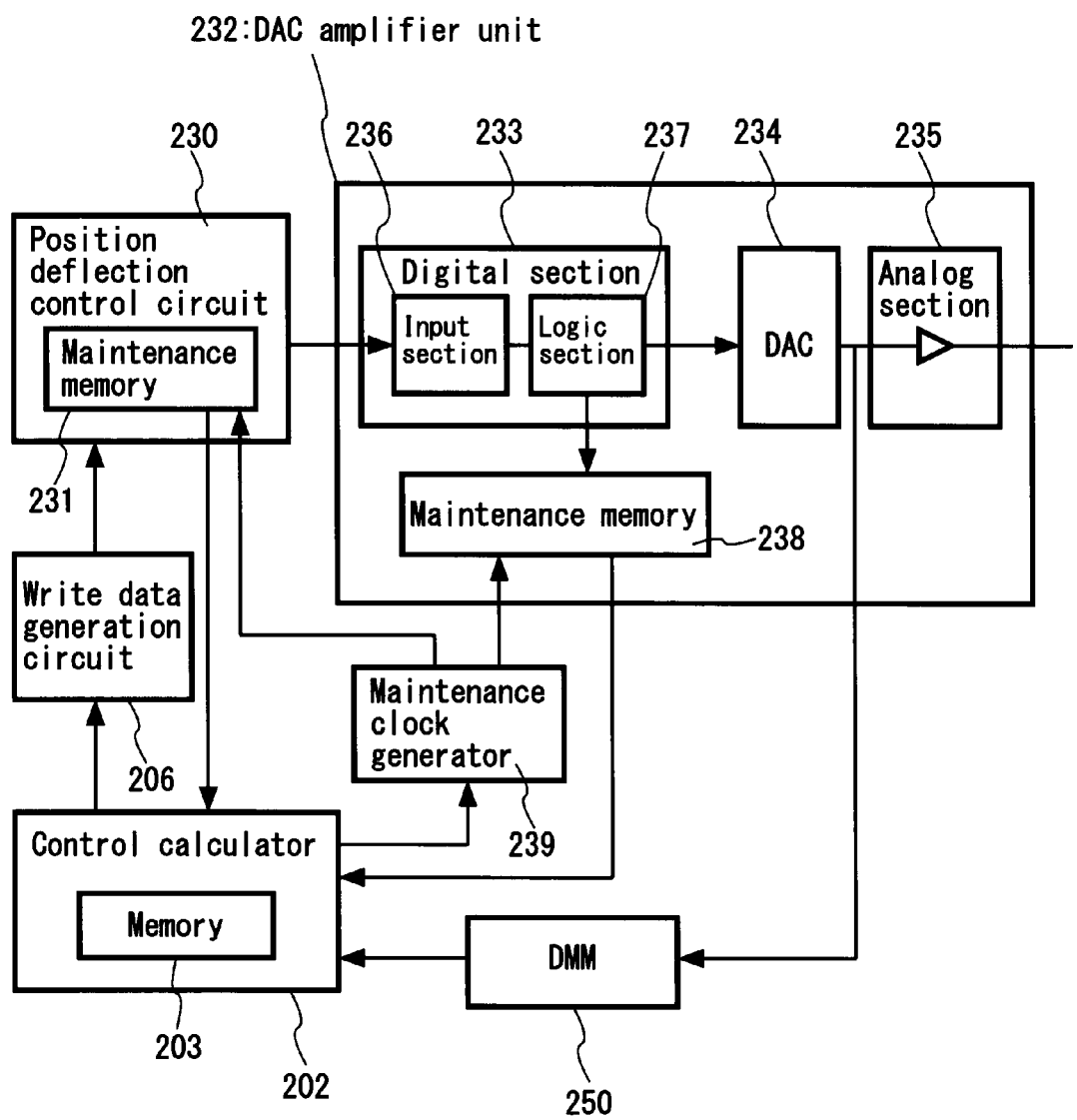
FIG. 4 is a diagram showing a configuration necessary to diagnose the DAC amplifier unit 232.

FIG. 4 is a diagram showing a configuration necessary to diagnose the DAC amplifier unit 232. The memory 203 is included in the control calculator 202 serving as a diagnosis unit. The memory 203 stores the pattern data that is to be used to diagnose the circuits.

To diagnose the DAC amplifier unit 232, the control calculator 202 transmits the pattern data, which is stored in the memory 203 and to be used to diagnose the circuits, to the write data generation circuit 206. The write data generation circuit 206 receives the pattern data. The write data generation circuit 206 then performs the distributed processing and the expansion processing on the received pattern data to generate write data that is to be used to diagnose the circuits. The write data generation circuit 206 transmits the generated write data to the position deflection control circuit 230. In synchronization with the transmission of the write data to the position deflection control circuit 230, the write data generation circuit 206 transmits the write data to the BLK deflection control circuit 210 and the shaping deflection control circuit 220.

The position deflection control circuit 230 receives the write data that is to be used to diagnose the circuits. The position deflection control circuit 230 generates a plurality of digital data pieces based on the received write data. The digital data pieces generated by the position deflection control circuit 230 are instruction voltage signals for the electrodes of the main deflector 130 and instruction voltage signals for the electrodes of the auxiliary deflector 132. The position deflection control circuit 230 transmits the generated digital data pieces to the DAC amplifier units 232 and 240 at the actual writing rate, while the position deflection control circuit 230 operates in synchronization with the DAC amplifier units 232 and 240. The digital data pieces (instruction voltage signals) transmitted to the DAC amplifier units 232 and 240 are of 16 bits (Hx8000 to 7FFF). The position deflection control circuit 230 stores the digital data pieces transmitted to the DAC amplifier units 232 in a maintenance memory 231. The maintenance memory 231 is provided in the position deflection control circuit 230. As long as the capacity of the maintenance memory 231 is the same as the capacity of a maintenance memory 238 (described later) included in each of the DAC amplifier units 232, the capacity of the maintenance memory 231 is sufficient.

Each of the DAC amplifier units 232 converts the digital data piece received from the position deflection control circuit 230 into an analog data piece and amplifies the converted analog data piece.

Each of the DAC amplifier units 232 has a digital section 233, a digital-to-analog converter (DAC) 234 and an analog section 235. The digital section 233 has an input section 236 and a logic section 237. The input section 236 receives the digital data piece from the position deflection control circuit 230. For example, the digital data piece of 16 bits (Hx8000 to 7FFF) is input to the input section 236 in parallel. The logic section 237 performs predetermined processing (e.g., correction processing) on the digital data piece input to the input section 236. The logic section 237 is composed of a field programmable gate array (FPGA), for example.

A digital data piece that is not subjected to the predetermined processing by means of the logic section 237 is output from the logic section 237 and stored in the maintenance memory 238. The maintenance memory 238 has a large capacity to store digital data pieces (instruction voltage signals) for ten thousand shots, for example.

A digital data piece that is subjected to the predetermined processing by means of the logic section 237 is input to the DAC 234. The DAC 234 converts the digital data piece into an analog data piece. The DAC 234 transmits the converted analog data piece to the analog section 235. The analog section 235 is composed of an amplifier circuit. The analog section 235 amplifies the received analog data piece to a predetermined level. The analog data pieces amplified by the analog sections 235 included in the DAC amplifier units 232 are applied to the respective electrodes of the main deflector 130. As described above, since the blanking is on during the diagnosis of the circuit, the sample 142 is not irradiated with the beam.

The control calculator 202 is connected with a maintenance clock generator 239. The maintenance clock generator 239 is adapted to generate a clock signal for reading of data. The maintenance clock generator 239 receives an instruction from the control calculator 202. The maintenance clock generator 239 transmits clock signals to the maintenance memories 231 and 238 based on the instruction. When the clock signals are input to the maintenance memories 231 and 238, the digital data stored in the maintenance memories 231 and 238 is read by the control calculator 202. The control calculator 202 compares the digital data read from the maintenance memory 231 with the digital data read from the maintenance memory 238 for each bit. Thus, the control calculator 202 can diagnose dynamic characteristics of the digital section 233 included in the DAC amplifier unit 232 in accordance with the comparison.

In the present embodiment, a linearity test, which is diagnosis of static characteristics, is performed in addition to the diagnosis of the dynamic characteristics. That is, the DAC 234 outputs the converted analog data to a digital multimeter (DMM) 250. The DMM 250 receives the analog data and converts the received analog data into digital data. Then, the DMM 250 outputs the converted digital data to the control calculator 202. The control calculator 202 receives the digital data from the DMM 250 and performs a linearity test that is diagnosis of static characteristics of the DAC amplifier unit 232 based on the received digital data.

Figure 5:
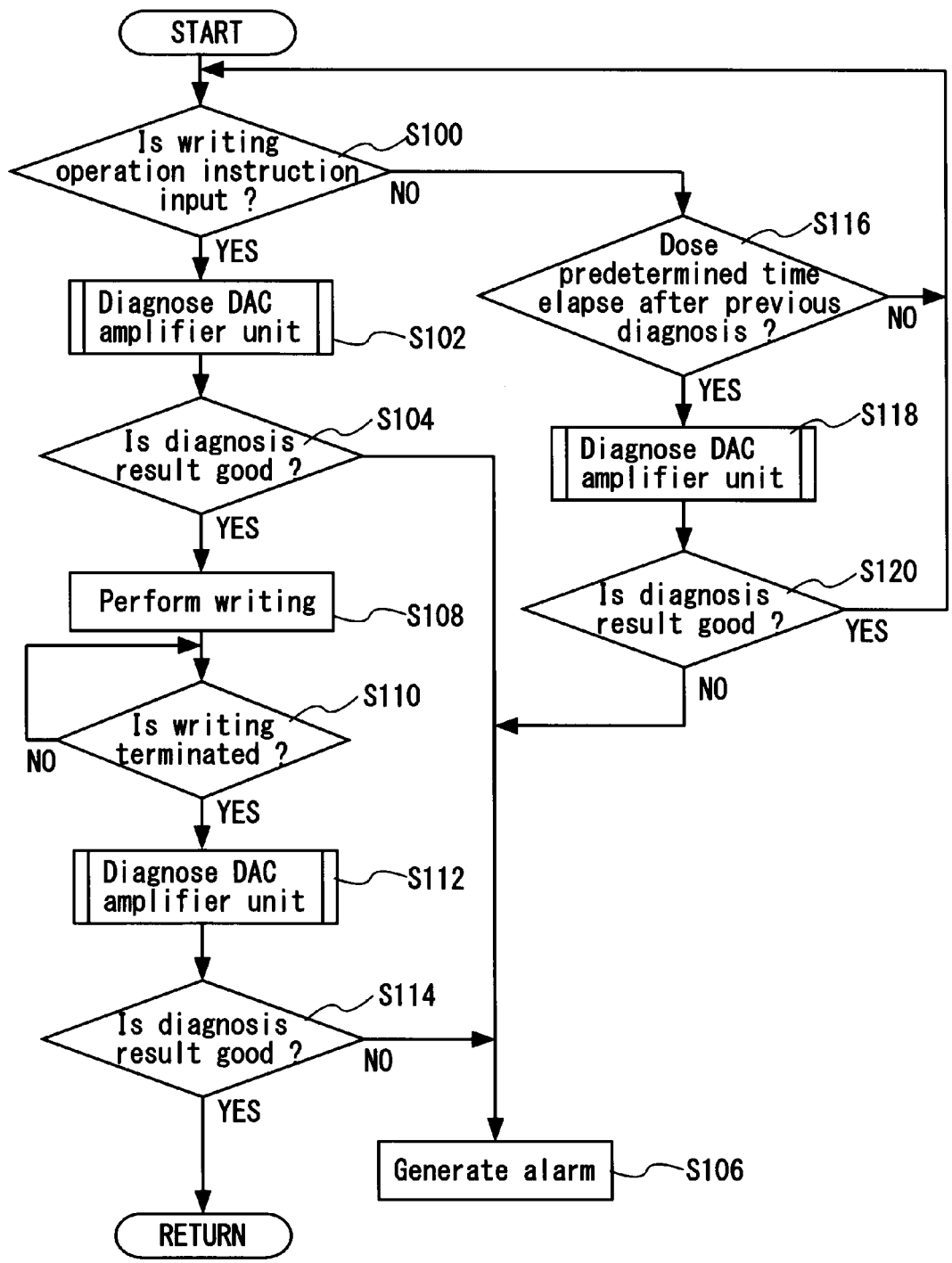
FIG. 5 is a flowchart of a diagnosis control routine performed by the DAC amplifier unit 232 according to the embodiment.
Figure 6:
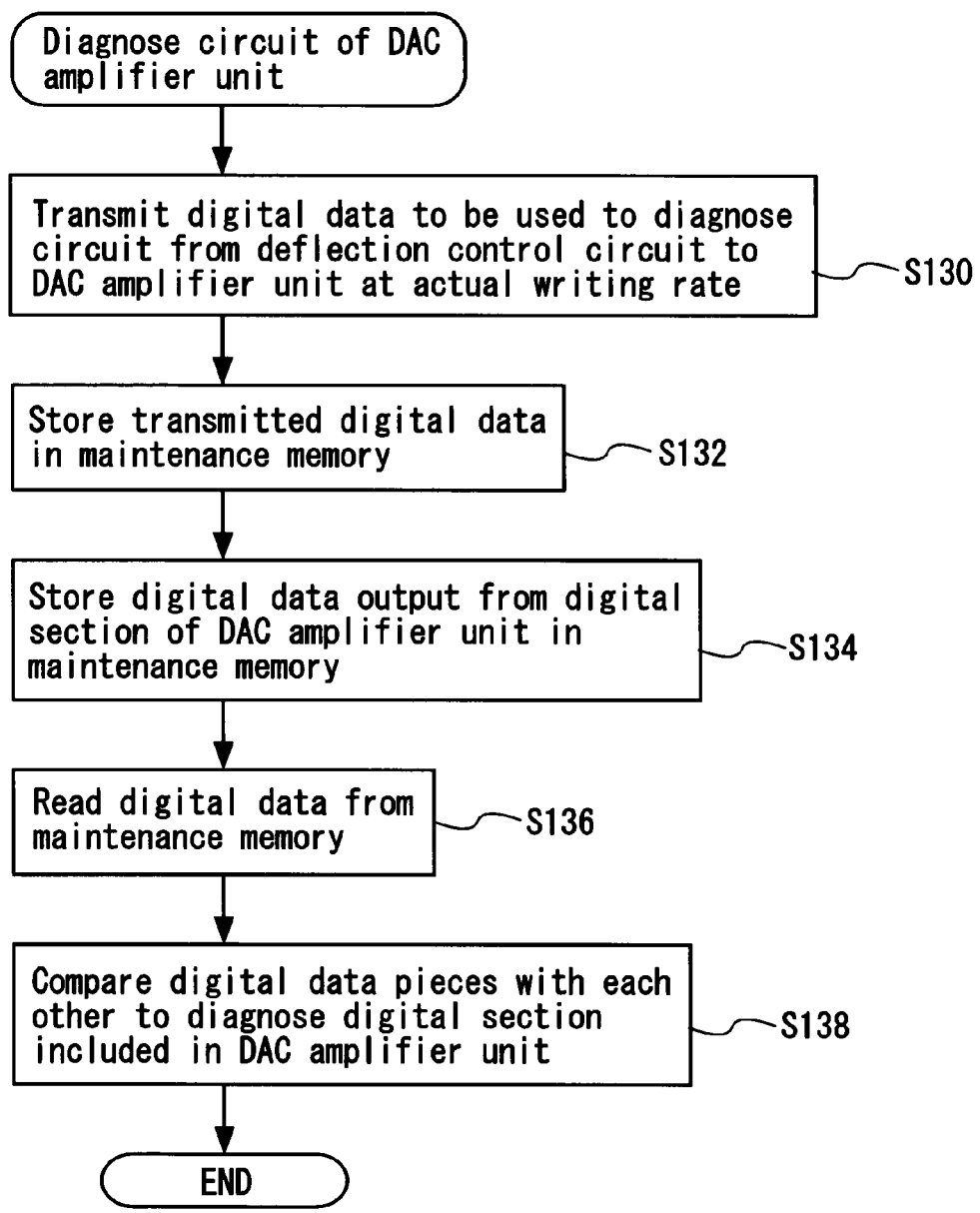
FIG. 6 is a flowchart of a subroutine performed in the routine shown in FIG. 5.

The following describes detail control to diagnose dynamic characteristics of the digital section 233 included in the DAC amplifier unit 232. FIG. 5 is a flowchart of a diagnosis control routine performed by the DAC amplifier unit 232 according to the embodiment. FIG. 6 is a flowchart of a subroutine performed in the routine shown in FIG. 5. The routine shown in FIG. 5 is activated at a predetermined time interval.

In the routine shown in FIG. 5, it is determined whether or not a writing operation instruction is input to the control calculator 202 in step S100. When an operator sets a reticle and presses a writing start button in order to start the writing, the writing operation instruction is input to the control calculator 202. When it is determined that the writing operation instruction is input to the control calculator 202 in step S100, the DAC amplifier unit 232 is diagnosed in step S102.

In step S102, the subroutine shown in FIG. 6 is activated. In the subroutine, the position deflection control circuit 230 transmits digital data that is to be used to diagnose the circuit of the digital section to the DAC amplifier unit 232 at the actual writing rate (i.e., the same rate as a rate of writing on a product reticle) in step S130. In step S130, data for one shot is transmitted at a rate of 100 nanoseconds or less, preferably at a rate of 60 nanoseconds.

In step S130, the pattern data stored in the memory 203 included in the control calculator 202 and to be used to diagnose the circuit is transmitted to the write data generation circuit 206. The write data generation circuit 206 receives the pattern data that is to be used to diagnose the circuit. The write data generation circuit 206 then performs distributed processing, expansion processing and the like on the received pattern data to generate write data that is to be used to diagnose the circuit. The write data generation circuit 206 then transmits the generated write data to the position deflection control circuit 230. The position deflection control circuit 230 receives the write data and generates digital data pieces that are to be used to diagnose the circuit. The generated digital data pieces are instruction voltage signals and are to be transmitted to the electrodes of the main deflector 130 and the electrodes of the auxiliary deflector 132. The position deflection control circuit 230 then transmits the generated digital data pieces to the DAC amplifier units 232.

Each of the digital data pieces that are to be used to diagnose the circuits is composed of an instruction voltage signal for a plurality of shots (e.g., ten thousand shots). It is desirable that the data have multiple bits that are repeatedly reversed at the same time. When multiple bits of the digital data piece input to the digital section 233 included in the DAC amplifier unit 232 are repeatedly reversed at the same time in the interval between two of the shots, an error may easily occur. Thus, the digital data having multiple bits that are repeatedly reversed at the same time is suitable to diagnose the dynamic characteristics of the digital section 233.

The digital data that is to be used to diagnose the circuit transmitted from the position deflection control circuit 230 to the DAC amplifier unit 232 is stored in the maintenance memory 231 included in the deflection control circuit 230 in step S132.

The data input to the input section 236 of the digital section 233 included in the DAC amplifier unit 232 is input to the logic section 237. The digital data output before the logic section 237 performs the predetermined processing on the data is stored in the maintenance memory 238 included in the DAC amplifier unit 232 in step S134.

After that, the digital data stored in the maintenance memories 231 and 238 is read in step S136. In step S136, when a maintenance clock signal generated by the maintenance clock generator 239 is input to the maintenance memories 231 and 238, the digital data stored in the maintenance memories 231 and 238 is read by the control calculator 202.

Next, the digital section 233 included in the DAC amplifier unit 232 is diagnosed by comparing the digital data read from the maintenance memory 231 in step S136 with the digital data read from the maintenance memory 238 in step S136 for each bit in step S138. After step S138, the subroutine is terminated.

Then, it is determined whether or not the diagnosis result obtained in step S102 is normal, that is, whether or not the digital data read from the maintenance memory 231 matches the digital data read from the maintenance memory 238 in step S104. When it is determined that the diagnosis result is not normal in step S104, that is, when the digital data read from the maintenance memory 231 does not match the digital data read from the maintenance memory 238, an alarm is generated in step S106 to prompt the operator of the electron beam writing apparatus to repair the digital section 233. The alarm includes information on bits that do not match (or cause an error). The information is displayed on a display section (not shown). When the diagnosis result is not normal, the writing is prohibited. This prevents a defective reticle from being manufactured.

When it is determined that the diagnosis result is normal in step S104, the blanking is turned off to perform the writing in step S108. When the writing in one reticle is terminated, an affirmative answer (YES) is given in step S110. After the writing, the subroutine shown in FIG. 6 is activated in the same way as step S102 to diagnose dynamic characteristics of the digital section 233 included in the DAC amplifier unit 232 in step S112. Performing the subroutine in step S112 makes it possible to diagnose whether or not a failure occurs in the digital section 233 included in the DAC amplifier unit 232 during the writing.

After that, it is determined whether or not the diagnosis result obtained in step S112 is normal in step S114. When it is determined that the diagnosis result is not normal in step S114, an alarm is generated in step S106 to prompt the operator to repair the digital section 233. The alarm generated in step S106 includes information on bits that do not match (or cause an error). The operator can recognize where a failure occurs in the digital section 233 included in the DAC amplifier unit 232 by finding the bits causing the error. When it is determined that the diagnosis result is normal in step S114, the routine is terminated.

When a reticle is not set and the writing start button is in an OFF state or the electron beam writing apparatus is in an idling state, a negative answer "NO" is given in step S100. After that, it is determined whether or not a predetermined time elapses after the previous circuit diagnosis is performed in step S116. The predetermined time is in a range of one hour to two hours. When it is determined that the predetermined time does not elapse after the previous diagnosis in step S116, the process proceeds back to step S100.

When it is determined that the predetermined time elapses after the previous diagnosis in step S116, the subroutine shown in FIG. 6 is activated in the same way as step S102 to diagnose the dynamic characteristics of the digital section 233 included in the DAC amplifier unit 232 in step S118. After that, it is determined whether or not the diagnosis result obtained in step S112 is normal in step S114. When it is determined that the diagnosis result is not normal in step S114, an alarm is generated in step S106 to prompt the operator to repair the digital section 233. When it is determined that the diagnosis result is normal in step S114, the routine is terminated.

As described above, the digital data pieces that are to be used to diagnose the circuits are input from the position deflection control circuit 230 to the DAC amplifier units 232 at the actual writing rate and stored in the maintenance memory 231 before and after the writing in the present embodiment. In response to the digital data, digital data is output from the digital section 233. The digital data that is not subjected to the predetermined processing by means of the digital section 233 is stored in the maintenance memory 238.

The digital data read from the maintenance memory 231 is compared with the digital data read from the maintenance memory 238 for each bit. This makes it possible to diagnose the dynamic characteristics of the digital section 233 included in the DAC amplifier unit 232.

The alarm includes information on bits that are included in the digital data pieces compared with each other and do not match each other. The alarm including the information is output. Thus, the operator can recognize where a failure occurs in the digital section 233 included in the DAC amplifier unit 232 and quickly repair the digital section 233. This can reduce a downtime of the electron beam writing apparatus.

The present invention is not limited to the embodiment described above, and can be modified in various ways within the spirit of the present invention. The electron beam is used in the embodiment. The present invention is not limited to the electron beam, and can be applied to another charged particle beam such as an ion beam.

In the routine shown in FIG. 5, the dynamic characteristics of the DAC amplifier unit are diagnosed before and after the writing and during the idling. The diagnosis may be performed at least either before or after the writing. When the time for the diagnosis is allowable, the dynamic characteristics of the DAC amplifier unit may be diagnosed during the writing.

In the aforementioned embodiment, the electron beam writing apparatus is configured to ensure that pattern data for diagnosis of the circuit previously causing a writing error is stored in the memory 203 included in the control calculator 202 and transmitted from the control calculator 202 to the DAC amplifier unit 232 through the write data generation circuit 206 and the position deflection control circuit 230. The present invention is not limited to this configuration. For example, digital data having multiple bits that are repeatedly reversed at the same time may be created in advance irrespectively of the pattern data, and then stored in the memory 203 as the digital data for diagnosis of the circuit. In this case, when the control calculator 202 transmits the created digital data directly to the position deflection control circuit 230 in step S130, the digital data for diagnosis of the circuit is transmitted from the position deflection control circuit 230 to the DAC amplifier unit 232. This allows various digital data for diagnosis of the circuit to be used.

The features and advantages of the present invention may be summarized as follows.

In the first aspect of the present invention, the first digital data for the circuit diagnosis is transmitted from the deflection control circuit to the DAC amplifier unit at the same rate as the rate of writing on the product reticle and stored. The second digital data output from the digital section included in the DAC amplifier unit is stored in response to the first digital data. The first and second digital data thus stored are read. The first and second digital data thus read are compared with each other for each bit to diagnose the digital section included in the DAC amplifier unit. According to the first aspect, dynamic characteristics of the digital section included in the DAC amplifier unit can be diagnosed.

In the second aspect of the present invention, the diagnosis unit causes the deflection control circuit to transmit the first digital data for the circuit diagnosis to the DAC amplifier unit at the same rate as the rate of writing on the product reticle and store the first digital data in the first maintenance memory. The second digital data output from the digital section of the DAC amplifier unit is stored in the second maintenance memory in response to the first digital data. The first digital data stored in the first maintenance memory and the second digital data stored in the second maintenance memory are read. The first digital data and the second digital data which have been read are compared with each other for each bit. Thus, dynamic characteristics of the digital section included in the DAC amplifier unit can be diagnosed according to the second aspect of the present invention.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-196055, filed on Jul. 30, 2008 including specification, claims, drawings and summary, on which the Convention priority of the present application is based, are incorporated herein by reference in its entirety.

What is claimed is:

1. A method for diagnosing a DAC amplifier unit in a charged particle beam writing apparatus comprising:
    transmitting pattern data from a control calculator to a deflection control circuit;
    generating first digital data based on the pattern data in the deflection control circuit;
    storing the first digital data in the deflection control circuit;
    transmitting the first digital data to a DAC amplifier unit at the same rate as a rate of writing;
    storing digital data which are outputted from the digital section, in the DAC amplifier, as a second digital data; and
    comparing the first digital data and the second digital data for each bit to diagnose the digital section.

2. The method for diagnosing the DAC amplifier unit in the charged particle beam writing apparatus according to claim 1, wherein data having multiple bits that are repeatedly reversed at the same time are used as the first digital data.

3. The method for diagnosing the DAC amplifier unit in the charged particle beam writing apparatus according to claim 1, wherein the digital section is diagnosed either before or after the writing.

4. The method for diagnosing the DAC amplifier unit in the charged particle beam writing apparatus according to claim 1, wherein, when the first digital data does not match the second digital data, information on bits that do not match each other are output as the result of the diagnosis.

5. The method for diagnosing the DAC amplifier unit in the charged particle beam writing apparatus according to claim 4, wherein the digital section is diagnosed either before or after the writing.

6. The method for diagnosing the DAC amplifier unit in the charged particle beam writing apparatus according to claim 4, wherein data having multiple bits that are repeatedly reversed at the same time are used as the first digital data.

7. The method for diagnosing the DAC amplifier unit in the charged particle beam writing apparatus according to claim 6, wherein the digital section is diagnosed either before or after the writing.

8. A charged particle beam writing apparatus comprising:
    a deflection control circuit for generating first digital data based on pattern data, by a control calculator of a charged particle beam writing apparatus, in a deflection control circuit, storing the first digital data in a first maintenance memory;
    a DAC amplifier unit including a digital section, a second maintenance memory, and a DAC, wherein the digital section is adapted to receive the first digital data from the deflection control circuit and is adapted to output the first digital data as a second digital data, the second maintenance memory adapted to store the second digital data which is outputted from the digital section, and the DAC is adapted to convert the second digital data into analog data; and
    a diagnosis unit that causes first digital data to be transmitted from the deflection control circuit to the DAC amplifier unit at the same rate as a rate of writing and stored in the first maintenance memory, and compares the first digital data with the second digital data stored in the second maintenance memory for each bit to diagnose the digital section.

9. A charged particle beam writing apparatus according to claim 8, wherein the control calculator serves as a diagnosis unit.

10. A charged particle beam writing apparatus according to claim 8, wherein the write data generation circuit receives the pattern data from the control calculator of the charged particle beam writing apparatus;
    the write data generation circuit transmits the generated write data to the deflection control circuit,
    the deflection control circuit then generates a first digital data based on the received data.

11. A charged particle beam writing apparatus according to claim 8, wherein the diagnosis unit generates an alarm when information on bits included in the digital data pieces do not match each other when compared.

12. A charged particle beam writing apparatus according to claim 8, wherein the diagnosis unit diagnoses the digital section of the DAC amplifier unit during the writing.

* * * * *

UNITED STATES PATENT AND TRADEMARK OFFICE
CERTIFICATE OF CORRECTION

| | |
|---|---|
| PATENT NO. | : 8,290,743 B2 |
| APPLICATION NO. | : 12/507385 |
| DATED | : October 16, 2012 |
| INVENTOR(S) | : Seiichi Tsuchiya et al. |

It is certified that error appears in the above-identified patent and that said Letters Patent is hereby corrected as shown below:

On the title page, Item (75), the second inventor's country name is incorrect. Item (75) should read:

-- (75) Inventors: Seiichi Tsuchiya, Shizuoka (JP)
                         Akinori Mine, Shizuoka (JP) --

Signed and Sealed this
Eighteenth Day of December, 2012

David J. Kappos
*Director of the United States Patent and Trademark Office*